United States Patent [19]

Yu

[11] Patent Number: 5,946,175
[45] Date of Patent: Aug. 31, 1999

[54] SECONDARY ESD/EOS PROTECTION CIRCUIT

[75] Inventor: Ta-Lee Yu, Hsinchu Hsien, Taiwan

[73] Assignee: Winbond Electronics Corp., Taiwan

[21] Appl. No.: 09/024,136

[22] Filed: Feb. 17, 1998

[51] Int. Cl.[6] .................................................. H02H 3/22
[52] U.S. Cl. ............................................. 361/56; 361/58
[58] Field of Search ............................... 361/56, 91, 111, 361/119, 58

[56] References Cited

U.S. PATENT DOCUMENTS

4,930,037  5/1990  Woo ............................................. 361/58
5,208,719  5/1993  Wei ............................................. 361/56
5,473,500  12/1995  Payne et al. ............................ 361/111

Primary Examiner—Ronald W. Leja
Attorney, Agent, or Firm—Proskauer Rose LLP

[57] ABSTRACT

To protect an input buffer from gate-oxide breakdown failure during an ESD/EOS event, an inventive secondary protection circuit is disclosed. In one embodiment, the protection circuit includes a first switch terminal connected to a pad, a second switch terminal connected to the buffer of an internal circuit, a control terminal, and an RC circuit connected between the control terminal and the supply voltage Vcc. The RC circuit delays a propagation of an ESD/EOS voltage from Vcc to the control terminal, so as to delay a generation of a conductive path between the first and second switch terminals until the ESD/EOS event lapses.

16 Claims, 6 Drawing Sheets

SECONDARY ESD/EOS PROTECTION CIRCUIT

FIELD OF THE INVENTION

The present invention relates to an ESD/EOS protection circuit, and more particularly, the present invention relates to a secondary ESD/EOS protection circuit for protecting against pad-to-buffer ESD/EOS events.

BACKGROUND OF THE INVENTION

ESD (electrostatic discharge) and EOS (electric overstress) protection design is a major factor in the reliability of deep-submicron CMOS Integrated Circuits (IC's). Since CMOS development technology is aggressive in the deep-submicron category, the device size and the thickness of the gate oxide are being continually reduced to improve the operating speed of the CMOS devices and integration density of the IC's. These highly scaled-down devices, however, have been found to be increasingly vulnerable to ESD and EOS. Therefore, ESD/EOS protection circuits have been added into the CMOS IC's to protect the IC's against ESD/EOS damage. Typically, ESD/EOS protection circuits are implemented around the input and output pads of the IC's to bypass ESD/EOS current away from the internal circuits of the IC's.

As a result of detailed investigations of ESD/EOS events on IC products, it is known that there are three main types of ESD/EOS events: Human-Body Model (HBM), Machine Model (MM), and Charged-Device Model (CDM).

Figure 1A:
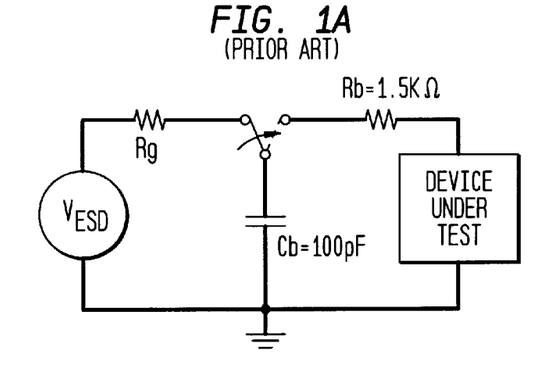
FIG. 1 depicts equivalent circuits of the (a) HBM, (b) MM, and (c) CDM ESD models.
Figure 1B:
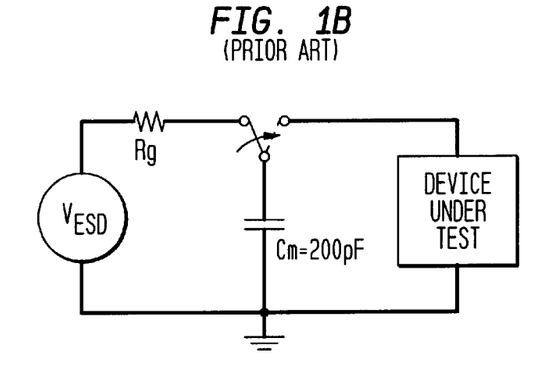

The equivalent circuits of these three ESD models are illustrated in FIG. 1. In the HBM and MM models, FIG. 1(a) and (b), respectively, the discharge current of the ESD/EOS event is from the outside of the IC into the inside of the IC, through the input or output pins. Therefore, the ESD protection circuit is designed to limit the ESD current into the internal parts of the IC from the input or output pins.

Figure 2:
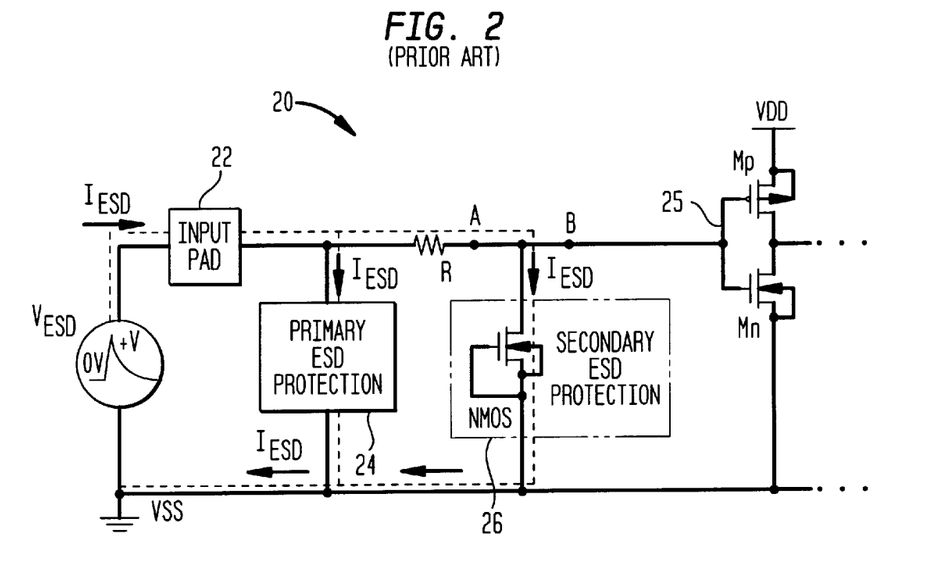
FIG. 2 shows a typical design of an ESD protection circuit to protect against HBM and MM ESD events.

A typical design for an ESD protection circuit 10 for HBM and MM ESD events is shown in FIG. 2, where there are primary and secondary ESD protection elements 40, 30, respectively. When an HBM or MM ESD voltage $V_{ESD}$ appears at the input pad 20, it acts as an input signal to the gate oxide 25 of the input stage. Since this ESD voltage $V_{ESD}$ may be sufficient to damage the gate oxide 25 of the input stage, it must be clamped by the ESD protection elements 40, 30. In FIG. 2, a short-channel thin-oxide NMOS is used as the secondary protection element 30 to first limit the ESD voltage $V_{ESD}$ across the gate oxide of the input stage. The short-channel thin-oxide NMOS 30 is designed to operate in its snapback-breakdown region, in order to clamp the voltage level across the gate oxide 25 of the input stage at as low a level as possible, when $V_{ESD}$ is positive.

A shorter channel length of the NMOS provides a lower snapback-breakdown voltage for clamping an ESD voltage, but is only effective at low ESD levels. Therefore, a primary ESD protection element 40, with greater ESD robustness is typically also connected to the input pad 20 to provide the main bypass for the ESD current. The devices commonly used as primary ESD protection elements are long-channel NMOS, field-oxide device (lateral bipolar transistor), or lateral SCR devices. The primary ESD protection devices with high ESD protection levels generally have a relatively high trigger (or breakdown) voltage, so that the secondary ESD protection device is activated first to clamp the ESD voltage across the gate oxide. Then, due to the increase of voltage drop across the series resistor R and the broken-down secondary ESD protection device 30, the primary ESD protection element 40 is triggered to bypass the main ESD current. Suitable designs of the ESD protection circuit of FIG. 2 can provide the input pads of IC's with high ESD robustness against HBM and MM ESD events.

Figure 1C:
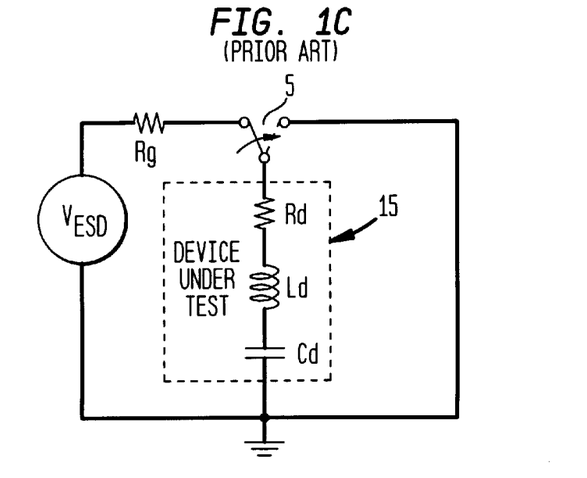

In the CDM ESD model, as shown in FIG. 1(c), the ESD voltage $V_{ESD}$ does not come from outside the IC 15, but rather from the device itself. The substrate of the IC 15 is assumed to be charged in a CDM ESD event, and then a pin 5 of the IC 15 is shorted to ground. The charging process does not subject the IC to any ESD damage. The static charge is stored in the equivalent capacitance (Cd) of the IC 15, which is dependent on the chip size and the type of IC package. The equivalent resistance (Rd) and inductance (Ld) of the IC 15 are also dependent on the IC itself and its package. When pin 5 of the charged IC touches ground, the discharge (ESD) current goes from the charged IC 15 to ground through pin 5. This CDM ESD current is discharged from the inside of the IC 15 to the outside of the IC 15. The discharging mechanism of the CDM ESD event is, therefore, quite different from that of the HBM or MM ESD events, and results in different kinds of ESD damage to the IC.

Figure 3:
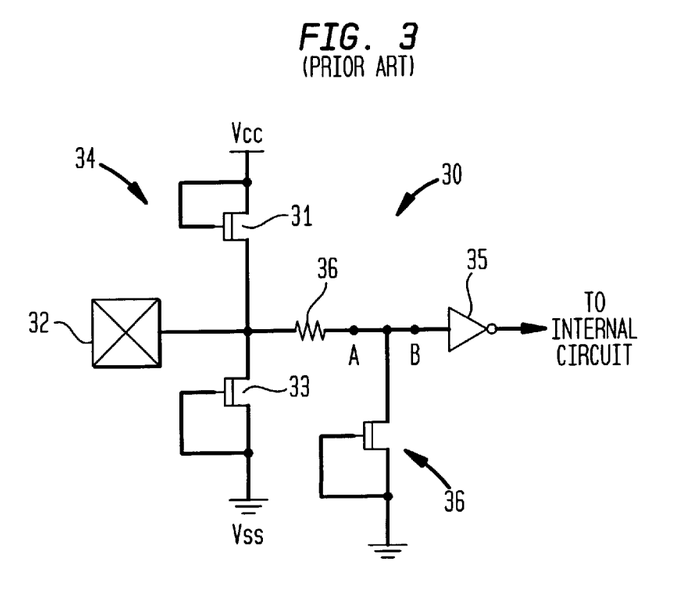
FIG. 3 shows a typical design of an ESD/EOS protection circuit to protect against CDM ESD/EOS events.

A typical design for an ESD/EOS protection circuit 10 for a CDM ESD/EOS events is shown in FIG. 3, where there are primary and secondary ESD/EOS protection elements 34, 36, respectively. Specifically, a signal is applied at an input pad or pin 32. A first transistor 31 and a second transistor 33 comprise the primary ESD/EOS protection circuit 34, and are employed to discharge high voltage pulses. A negative-going pulse generated by an ESD/EOS event is discharged via first transistor 31. The gate of the first transistor is tied to Vcc. The negative-going ESD/EOS pulse will turn off the second transistor 33, which has a source connected to ground Vss. Typically, the primary circuit 34 discharges most of the ESD/EOS pulses by establishing a path to either Vcc or Vss. The second ESD/EOS protection circuit 36, is designed to the discharge the remainder of the charge by means of drain voltage punch-through. In addition, resister 36 is included between input pad 32 and the internal circuitry 35 to ensure that the first and second transistors 31 and 33 are the lower impedance paths for discharging most of the charge from an ESD/EOS event before reaching the thin gate of the second ESD/EOS protection circuit 36.

However, the thin gate transistor of circuit 36 is susceptible to gate aided junction breakdown. If the voltage across the transistor exceeds the breakdown voltage of the device, damage to the transistor may result in permanent shorting of the input signal to ground Vss.

In addition, during an ESD/EOS event, especially in a PS mode (where ESD/EOS stress is a positive ESD/EOS voltage relative to a grounded Vss pin), the voltage at node B will be at the clamping voltage. We may assume that the primary circuit 34 of FIG. 3 is NMOS. Therefore, at a 0.5 $\mu$m process, the NMOS breakdown voltage is approximately 12 V, and the gate oxide thickness at breakdown is approximately 90 to 120 Å. Under such conditions, the input buffer 35 is susceptible to the gate-oxide breakdown failure during an ESD/EOS event.

Accordingly, it is an object of the present invention to overcome the deficiencies in the prior art.

SUMMARY OF THE INVENTION

To protect an input buffer from gate-oxide breakdown failure during an ESD/EOS event, an inventive secondary protection circuit is disclosed. In a first embodiment, the protection circuit includes a first switch terminal connected to a pad, a second switch terminal connected to the buffer of an internal circuit, a control terminal, and an RC circuit connected between the control terminal and the supply voltage Vcc. The RC circuit delays a propagation of an ESD/EOS voltage from Vcc to the control terminal, so as to delay a generation of a conductive path between the first and second switch terminals until the ESD/EOS event lapses. In addition, a transistor having a gate connected to the control terminal and a source and a drain connected a respective first and second switch terminal is included.

As an aspect of the first embodiment, the RC circuit is connected in parallel with the gate of an NMOS transistor. The RC circuit comprises a resistor connected in series with a capacitor, wherein the resistor is further connected to Vcc and the capacitor is further connected to Vss.

In a second embodiment of the present invention, a pair of invertors are connected in series to the gate of the transistor to further delay the ESD/EOS voltage.

In a third embodiment of the present invention, the RC circuit comprises a capacitor connected in series with a resistor, wherein the capacitor is further connected to Vcc, and the resistor is further connected to Vss. In addition, three invertors are connected in series to the gate of the transistor to further delay the ESD/EOS voltage.

In a fourth embodiment of the present invention, the secondary circuit includes a first switch terminal connected to a pad, a second switch terminal connected to the buffer of an internal circuit, a control terminal, and a transistor having a gate connected to the control terminal and a source and a drain connected to the respective first and second switch terminals. The transistor is in an off state during an ESD/EOS voltage from Vcc to the control terminal, so as to prohibit a generation of a conductive path between the first and second switch terminals until the ESD/EOS event lapses.

In a fifth embodiment of the present invention, a resistor is connected between the gate of the transistor and Vcc to further delay the ESD/EOS voltage.

In a sixth embodiment of the present invention, the RC circuit is connected in parallel with the gate of a PMOS transistor. Further, the RC circuit comprises a capacitor connected in series with a resistor, wherein the capacitor is further connected to Vcc, and the resistor is further connected to Vss. In addition, three invertors are connected in series to the gate of the NMOS transistor to further delay the ESD/EOS voltage.

In a seventh embodiment of the present invention, the RC circuit is connected in parallel with the gate of a PMOS transistor. Further, the RC circuit comprises a capacitor connected in series with a resistor, wherein the capacitor is further connected to Vcc, and the resistor is further connected to Vss. In addition, three invertors are connected in series to the gate of the transistor to further delay the ESD/EOS voltage. In addition, a pair of invertors are connected in series to the gate of the PMOS transistor to further delay the ESD/EOS voltage.

In a eighth embodiment of the present invention, the RC circuit is connected in parallel with the gate of a PMOS transistor. Further, an invertor is connected in series to the gate of the PMOS transistor to further delay the ESD/EOS voltage.

In a ninth embodiment of the present invention, an RC circuit is connected to the gates of an NMOS and a PMOS transistor. Further, the RC circuit comprises a capacitor connected in series with a resistor, wherein the capacitor is further connected to Vcc, and the resistor is further connected to Vss.

BRIEF DESCRIPTION OF THE DRAWINGS

The following detailed description, giving by way of example and not intended to limit the present invention solely thereto, will best be understood in conjunction with the accompanying drawings in which like reference numbers depict like elements.

DETAILED DESCRIPTION OF THE INVENTION

Figure 4:
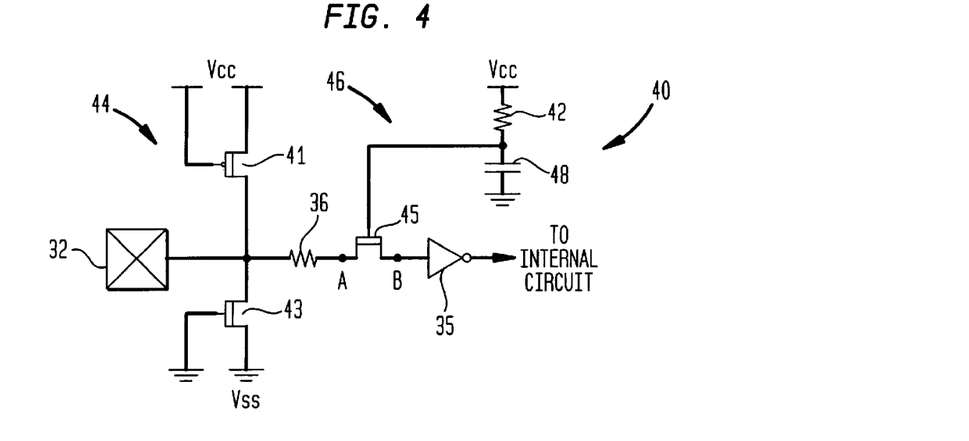
FIG. 4 shows a ESD/EOS protection device having a secondary protection circuit in accordance with a first embodiment of the present invention.

FIG. 4 shows an ESD/EOS protection device 40 having the inventive secondary ESD/EOS protection circuit in a first embodiment of the present invention. Specifically, device 40 includes a primary ESD/EOS protection circuit 44 and an inventive secondary protection circuit 46. Similar to the primary circuit 34 of FIG. 3, primary circuit 44 includes a pair of transistors, where one is connected to Vcc and the other is connected to Vss. In particular, PMOS transistor 41 is has its source and gate connected to Vcc, while its drain is connected to the drain of NMOS transistor 43. The source and gate of NMOS transistor 43 is connected to ground Vss. Of course, one having skill in the art will appreciate that other configurations (such that of FIG. 3) can be used as well when designing the primary protection circuit.

A secondary ESD/EOS protection circuit 46 is located between nodes A and B (switch terminals) in device 40. Secondary circuit 46 includes an RC circuit having a resistor 42 and a capacitor 48 connected in series. Illustratively, the time constant of the RC circuit is greater than or equal to 150 ns (as is the case with FIGS. 5, 6 and 9–12, as well). In addition, an NMOS transistor 45 is connected to the RC circuit in parallel.

The operation of the secondary circuit will now be described. During an ESD/EOS event, transistor 45 will be in an off state due to the delay provided by the RC circuit. In other words, the RC circuit will cause transistor 45 to be off for a predetermined amount of time due to the low voltage potential through a control terminal at the gate of transistor 45. Accordingly, the ESD/EOS current will be unable to flow between input pad 32 and the inverter buffer 35 of the internal circuit. When the latency ends, the transistor is switched on and the ESD/EOS event will have subsided.

During normal operation, i.e., when an ESD/EOS event does not occur, the gate potential of transistor 45 will approach Vcc, such that transistor 45 will be in its on state allowing current to flow between input pad 32 and the internal circuit.

Figure 5:
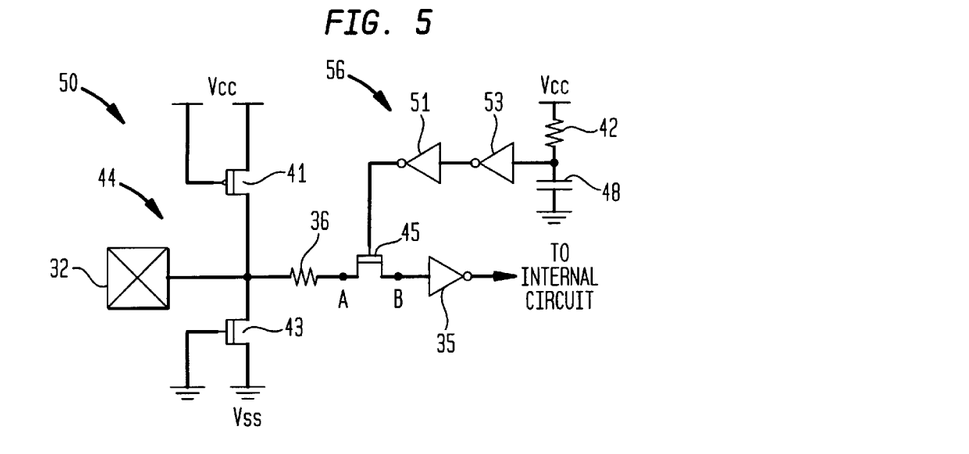
FIG. 5 shows a ESD/EOS protection device having a secondary protection circuit in accordance with a second embodiment of the present invention.

FIG. 5 shows an ESD/EOS protection device 50 having the inventive secondary ESD/EOS protection circuit in a second embodiment of the present invention. Specifically, device 50 includes a primary ESD/EOS protection circuit 44 and an inventive secondary protection circuit 56.

Secondary circuit 46 includes an RC circuit having a resistor 42 and a capacitor 48 connected in series. In addition, NMOS transistor 45 is connected to invertors 51, 53, which are connected to the RC circuit in parallel. Invertors 51, 53 are added to the protection circuit to further delay any ESD/EOS voltages from passing through transistor 45 by ensuring transistor 45 is in its off state.

Figure 6:
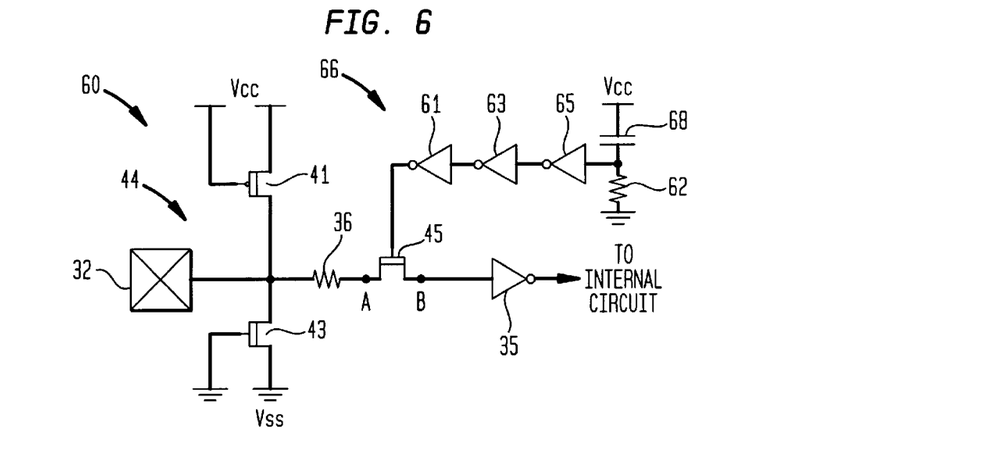
FIG. 6 shows a ESD/EOS protection device having a secondary protection circuit in accordance with a third embodiment of the present invention.

FIG. 6 shows an ESD/EOS protection device 60 having the inventive secondary ESD/EOS protection circuit in a third embodiment of the present invention. Specifically, device 60 includes a primary ESD/EOS protection circuit 44 and an inventive secondary protection circuit 66.

Secondary circuit 46 includes an RC circuit having a resistor 62 and a capacitor 68 connected in series. Note, however, that the RC circuit is reversed with respect to FIGS. 4 and 5. In addition, NMOS transistor 45 is connected to invertors 61, 63, 65 which are connected to the RC circuit in parallel. Similar to secondary circuit 56 of FIG. 5, invertors 61, 63, 65 are added to the protection circuit to further delay any ESD/EOS voltages from passing through transistor 45 by ensuring transistor 45 is in its off state.

Figure 7:
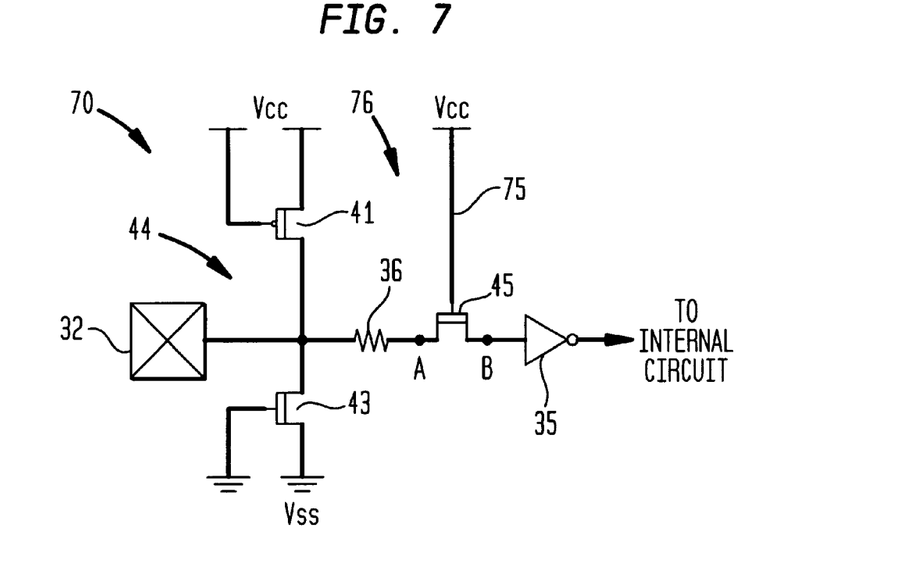
FIG. 7 shows a ESD/EOS protection device having a secondary protection circuit in accordance with a fourth embodiment of the present invention.

FIG. 7 shows an ESD/EOS protection device 70 having the inventive secondary ESD/EOS protection circuit in a fourth embodiment of the present invention. Specifically, device 70 includes a primary ESD/EOS protection circuit 44 and an inventive secondary protection circuit 76.

Secondary circuit 76 is essentially a line 75 connecting Vcc to the gate of transistor 45. As is known, an NMOS transistor has an inherent resistance and capacitance which may, in certain lower voltage situations, be sufficient to delay the off state of transistor 45 during an ESD/EOS event, i.e., the inherent resistance-capacitance of the gate is sufficient to achieve the desired RC constant.

Figure 8:
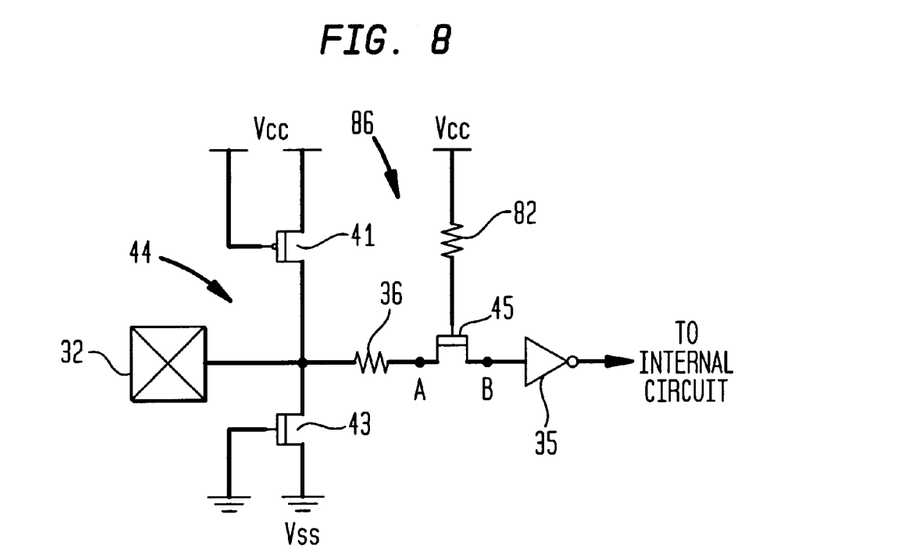
FIG. 8 shows a ESD/EOS protection device having a secondary protection circuit in accordance with a fifth embodiment of the present invention.

FIG. 8 shows an ESD/EOS protection device 80 having the inventive secondary ESD/EOS protection circuit in a fourth embodiment of the present invention. Specifically, device 80 includes a primary ESD/EOS protection circuit 44 and an inventive secondary protection circuit 86.

Secondary circuit 86 is similar to secondary circuit 76 of FIG. 7, except that a resistor 82 is added. This embodiment may be utilized when the inherent capacitance of transistor's 45 gate is sufficient but the resistance is insufficient to achieve the desired RC constant.

Figure 9:
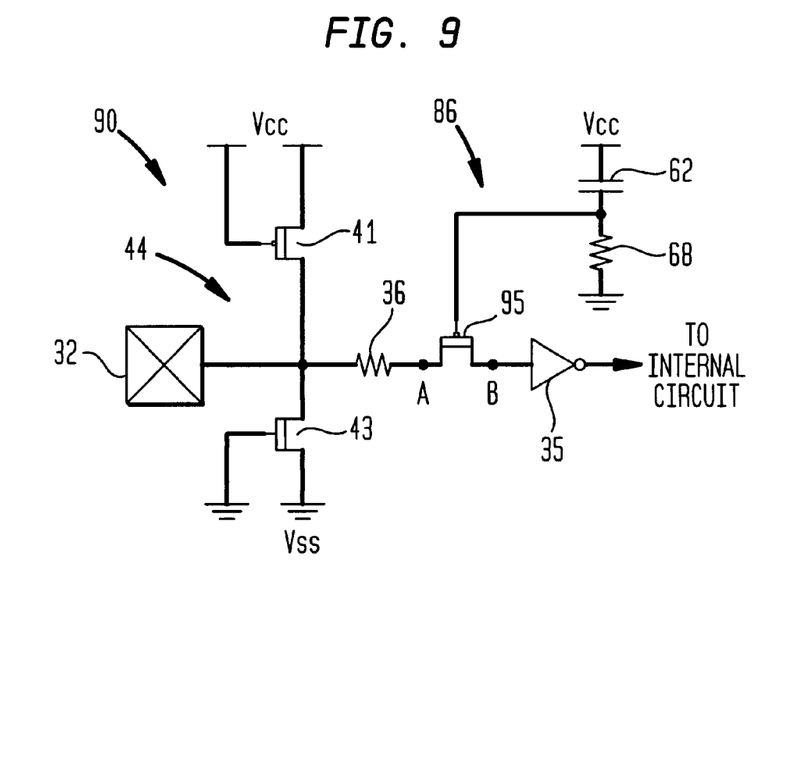
FIG. 9 shows a ESD/EOS protection device having a secondary protection circuit in accordance with a sixth embodiment of the present invention.

FIG. 9 shows an ESD/EOS protection device 90 having the inventive secondary ESD/EOS protection circuit in a sixth embodiment of the present invention. Specifically, device 90 includes a primary ESD/EOS protection circuit 44 and an inventive secondary protection circuit 96.

Secondary circuit 96 includes an RC circuit having a resistor 62 and a capacitor 68 connected in series. The resistor is connected to ground Vss, while the capacitor is connected to power source Vcc. In addition, a PMOS transistor 95 has its gate connected to the RC circuit and its drain and source connected to switch terminals A and B, respectively.

Figure 10:
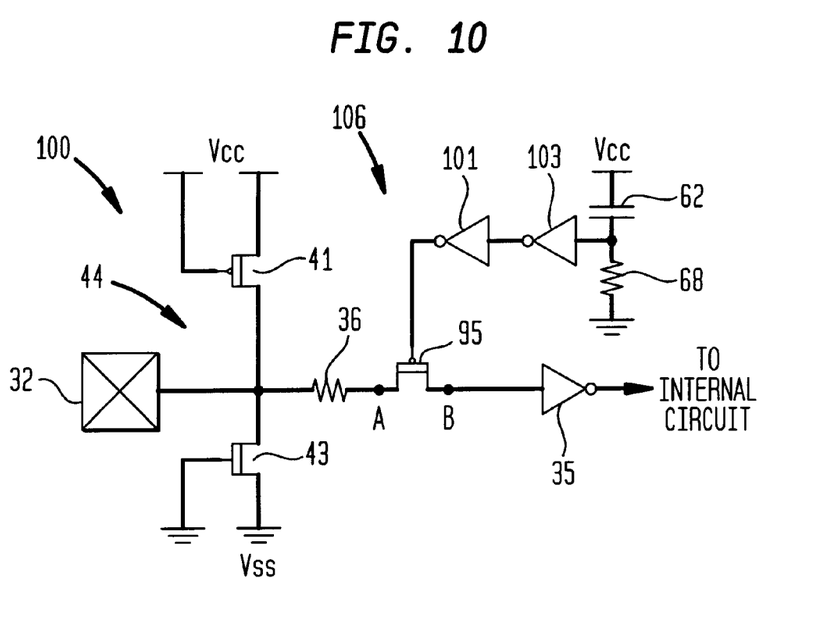
FIG. 10 shows a ESD/EOS protection device having a secondary protection circuit in accordance with a seventh embodiment of the present invention.

FIG. 10 shows an ESD/EOS protection device 100 having the inventive secondary ESD/EOS protection circuit in a seventh embodiment of the present invention. Specifically, device 100 includes a primary ESD/EOS protection circuit 44 and an inventive secondary protection circuit 106.

Secondary circuit 106 includes an RC circuit having a resistor 62 and a capacitor 68 connected in series. The resistor is connected to ground Vss, while the capacitor is connected to power source Vcc. In addition, a PMOS transistor 95 is connected to invertors 101 and 103 which are connected to the RC circuit in parallel. Similar to the invertors of FIGS. 5, 6 and 11, invertors 101 and 103 are added to the protection circuit to further delay any ESD/EOS voltages from passing through transistor 95 by ensuring transistor 95 is in its off state.

Figure 11:
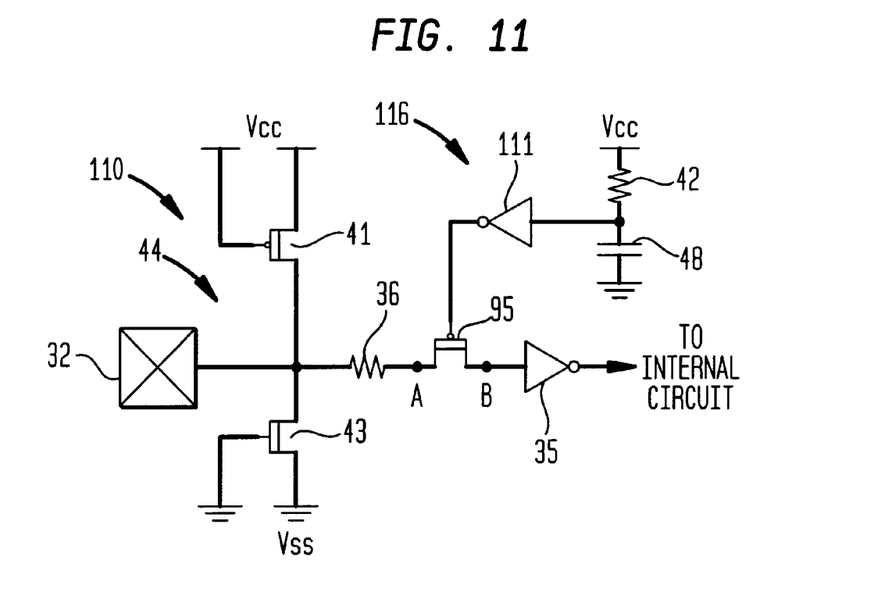
FIG. 11 shows a ESD/EOS protection device having a secondary protection circuit in accordance with a eighth embodiment of the present invention.

FIG. 11 shows an ESD/EOS protection device 110 having the inventive secondary ESD/EOS protection circuit in a eighth embodiment of the present invention. Specifically, device 110 includes a primary ESD/EOS protection circuit 44 and an inventive secondary protection circuit 116.

In this embodiment, secondary circuit 116 includes an RC circuit having a resistor 42 and a capacitor 48 connected in series. The capacitor is connected to ground Vss, while the capacitor is connected to power source Vcc. In addition, a PMOS transistor 95 is connected to an invertor 111 which is connected to the RC circuit in parallel. The invertor is added to the protection circuit to further delay any ESD/EOS voltages from passing through PMOS transistor 95 by ensuring transistor 95 is in its off state.

Figure 12:
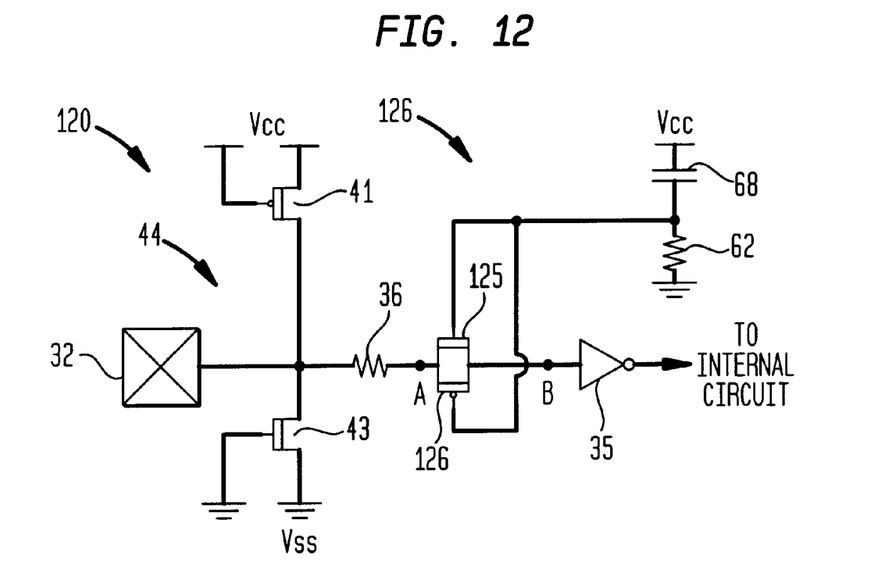
FIG. 12 shows a ESD/EOS protection device having a secondary protection circuit in accordance with a ninth embodiment of the present invention.

FIG. 12 shows an ESD/EOS protection device 120 having the inventive secondary ESD/EOS protection circuit in a ninth embodiment of the present invention. Specifically, device 120 includes a primary ESD/EOS protection circuit 44 and an inventive secondary protection circuit 126.

Secondary circuit 96 includes an RC circuit having a resistor 62 and a capacitor 68 connected in series. The resistor is connected to ground Vss, while the capacitor is connected to power source Vcc. A PMOS transistor 95 has its gate connected to the RC circuit and its drain and source connected to switch terminals A and B, respectively. In addition, an NMOS transistor 95 has its gate connected to the RC circuit and its source and drain connected to switch terminals A and B, respectively.

Finally, the above-discussion is intended to be merely illustrative of the invention. Numerous alternative embodiments may be devised by those having ordinary skill in the art without departing from the spirit and scope of the following claims.

What is claimed is:

1. A secondary ESD/EOS protection circuit for protecting against a pad-to-buffer ESD/EOS event, comprising:

a first switch terminal connected to a pad;

a second switch terminal connected to a buffer of an internal circuit;

a control terminal;

a switch comprising a first thin-gate MOS transistor having its thin-gate connected to said control terminal and its source and drain connected to a respective one of said first and second switch terminals, wherein said thin-gate MOS transistor being formed by a 0.5 micron or smaller process; and an RC circuit connected between said control terminal and a supply voltage, wherein said RC circuit delays a propagation of an ESD/EOS voltage from said supply voltage to said control terminal, so as to delay a generation of a conductive path between said first and second switch terminals until said ESD/EOS event lapses, and wherein said switch being in an off-state during an ESD/EOS voltage from said supply voltage to said control terminal, so as to prohibit a generation of a conductive path between said first and second switch terminals until said ESD/EOS event lapses, and being in an on-state otherwise.

2. The circuit of claim 1, wherein said RC circuit, connected in parallel with the gate of said transistor, comprises a resistor connected in series with a capacitor, wherein said resistor being further connected to Vcc, and said capacitor being further connected to Vss.

3. The circuit of claim 2, further comprising a second MOS transistor having its gate connected to said control terminal and its source and drain connected to a respective one of said first and second switch terminals.

4. The circuit of claim 3, wherein said first MOS transistor has an n-type conductivity and said second MOS transistor has a p-type conductivity.

5. The circuit of claim 2, further comprising at least one invertor connected between said gate of said transistor and said RC circuit to further delay said ESD/EOS voltage.

6. The circuit of claim 5, wherein said at least one invertor being a pair of invertors in series.

7. The circuit of claim 6, wherein said first MOS transistor is n-type.

8. The circuit of claim 6, wherein said first MOS transistor is p-type.

9. The circuit of claim 1, wherein said RC circuit, connected in parallel with the gate of said transistor, comprises a capacitor connected in series with a resistor, wherein said capacitor being further connected to Vcc, and said resistor being further connected to Vss.

10. The circuit of claim 9, wherein said first MOS transistor is n-type.

11. The circuit of claim 10, further comprising at least one invertor connected to said gate of said transistor to further delay said ESD/EOS voltage.

12. The circuit of claim 11, wherein said at least one invertor being three invertors in series.

13. The circuit of claim 9, wherein said first MOS transistor is p-type.

14. The circuit of claim 13, further comprising at least one invertor connected to said gate of said transistor to further delay said ESD/EOS voltage.

15. The circuit of claim 14, wherein said at least one invertor being two invertors in series.

16. A secondary ESD/EOS protection circuit for protecting against a pad-to-buffer ESD/EOS event, comprising:

a first switch terminal connected to a pad;

a second switch terminal connected to a buffer of an internal circuit;

a control terminal;

an RC circuit connected between said control terminal and a supply voltage; and a switch comprising:
a thin-gate NMOS transistor having its gate connected to said control terminal and its source and drain connected to said first and second switch terminals, respectively, and
a thin-gate PMOS transistor having its gate connected to said control terminal and its drain and source connected to said first and second switch terminals, respectively, wherein said thin-gate NMOS and PMOS transistors being formed by a 0.5 micron or smaller process, wherein said RC circuit, connected in parallel with the gate of said NMOS and PMOS transistors, comprises a resistor connected in series with a capacitor, wherein said capacitor being further connected to Vcc, and said resistor being further connected to Vss, wherein said RC circuit delays a propagation of an ESD/EOS voltage from said supply voltage to said control terminal, so as to delay a generation of a conductive path between said first and second switch terminals until said ESD/EOS event lapses, and wherein said switch being in an off-state during an ESD/EOS voltage from said supply voltage to said control terminal, so as to prohibit a generation of a conductive path between said first and second switch terminals until said ESD/EOS event lapses, and being in an on-state otherwise.

* * * * *